United States Patent
Wei et al.

(10) Patent No.: US 10,804,061 B2
(45) Date of Patent: Oct. 13, 2020

(54) SURFACE-TUNNELING MICRO ELECTRON SOURCE AND ARRAY AND REALIZATION METHOD THEREOF

(71) Applicant: PEKING UNIVERSITY, Beijing (CN)

(72) Inventors: Xianlong Wei, Beijing (CN); Gongtao Wu, Beijing (CN)

(73) Assignee: PEKING UNIVERSITY, Beijing (CN)

(*) Notice: Subject to any disclaimer, the term of this patent is extended or adjusted under 35 U.S.C. 154(b) by 0 days.

(21) Appl. No.: 16/329,688

(22) PCT Filed: Jul. 24, 2017

(86) PCT No.: PCT/CN2017/094029
§ 371 (c)(1),
(2) Date: Feb. 28, 2019

(87) PCT Pub. No.: WO2018/040791
PCT Pub. Date: Mar. 8, 2018

(65) Prior Publication Data
US 2019/0198279 A1 Jun. 27, 2019

(30) Foreign Application Priority Data

Aug. 29, 2016 (CN) .......................... 2016 1 0757325
May 27, 2017 (CN) .......................... 2017 1 0390423

(51) Int. Cl.
*H01J 3/02* (2006.01)
*H01J 9/18* (2006.01)
(Continued)

(52) U.S. Cl.
CPC .............. *H01J 1/312* (2013.01); *H01J 1/304* (2013.01); *H01J 1/316* (2013.01); *H01J 9/025* (2013.01);
(Continued)

(58) Field of Classification Search
CPC ...................... H01J 1/312; H01J 1/316; H01J 2201/312–3195; H01J 1/20–316
See application file for complete search history.

(56) References Cited

U.S. PATENT DOCUMENTS

| 3,056,073 A | 9/1962 | Mead |
| 3,184,636 A | 5/1965 | Dore et al. |

(Continued)

FOREIGN PATENT DOCUMENTS

| CN | 1126136 C | 10/2003 |
| CN | 1539152 A | 10/2004 |

(Continued)

OTHER PUBLICATIONS

C.A. Mead; "Operation of Tunnel-Emission Devices"; Journal of Applied Physics, 1961, 32, pp. 646-652.

(Continued)

*Primary Examiner* — Mariceli Santiago
(74) *Attorney, Agent, or Firm* — Harness, Dickey & Pierce, P.L.C.

(57) ABSTRACT

A tunneling electro source, an array thereof and methods for making the same are provided. The tunneling electron source is a surface tunneling micro electron source having a planar multi-region structure. The tunneling electron source includes an insulating substrate, and two conductive regions and one insulating region arranged on a surface of the insulating substrate. The insulating region is arranged between the two conductive regions and abuts on the two conductive regions. Minimum spacing between the two conductive regions, which equals to a minimum width of the insulating region, is less than 100 nm.

18 Claims, 7 Drawing Sheets

(51) Int. Cl.
  *H01J 1/312*   (2006.01)
  *H01J 1/304*   (2006.01)
  *H01J 1/316*   (2006.01)
  *H01J 9/02*    (2006.01)
  *H01J 37/073*  (2006.01)
  *H01J 35/06*   (2006.01)

(52) U.S. Cl.
  CPC .............. *H01J 9/027* (2013.01); *H01J 9/18* (2013.01); *H01J 35/065* (2013.01); *H01J 37/073* (2013.01); *H01J 2201/30449* (2013.01); *H01J 2201/30461* (2013.01)

(56) References Cited

U.S. PATENT DOCUMENTS

| | | | |
|---|---|---|---|
| 3,214,629 A | 10/1965 | Apker | |
| 3,706,920 A | 12/1972 | Caldwell et al. | |
| 4,825,082 A * | 4/1989 | Okunuki | H01J 1/316 250/423 F |
| 6,037,606 A | 3/2000 | Ema | |
| 2002/0167001 A1 | 11/2002 | Chen et al. | |
| 2006/0125370 A1* | 6/2006 | Nishimura | H01J 1/316 313/310 |
| 2006/0232191 A1* | 10/2006 | Yang | H01J 29/02 313/497 |
| 2007/0035229 A1* | 2/2007 | Mikami | H01J 29/04 313/495 |
| 2007/0090476 A1 | 4/2007 | Geis et al. | |
| 2009/0072697 A1 | 3/2009 | Hiroki et al. | |
| 2009/0284120 A1 | 11/2009 | Nukanobu et al. | |
| 2014/0332753 A1* | 11/2014 | Xiao | H01L 29/0665 257/12 |

FOREIGN PATENT DOCUMENTS

| | | |
|---|---|---|
| CN | 101582355 A | 11/2009 |
| CN | 106252179 A | 12/2016 |

OTHER PUBLICATIONS

Toshiaki Kusunoki et al.; "Emission Current Enhancement of MIM Cathodes by Optimizing the Tunneling Insulator Thickness"; IEEE Transactions on Electron Devices, 2000, vol. 49, No. 6, Jun. 2002; pp. 1059-1065.

Mutsumi Suzuki et al.; "Enhancing Electron-Emission Efficiency of MIM Tunneling Cathodes by Reducing Insulator Trap Density"; IEEE Transactions on Electron Devices; vol. 59, No. 8, Aug. 2012, pp. 2256-2262.

Mutsumi Suzuki et al. "Field-Emission Display Based on Nonformed MIM-Cathode Array"; IEEE Transactions on Electron Devices, vol. 49, No. 6, Jun. 2002; pp. 1005-1011.

Toshiaki Kusunoki et al.; "Increasing Emission Current from MIM Cathodes by Using an Ir—Pt—Au Multilayer Top Electrode"; IEEE Transactions on Electron Devices, vol. 47, No. 8, Aug. 2000, pp. 1667-1672.

Chinese Office Action for Chinese Application No. 201710390423. 2, dated Jun. 5, 2018, with English translation thereof.

International Search Report and Written Opinion for International Application No. PCT/CN2017/094029, dated Oct. 30, 2017, with English translation thereof.

* cited by examiner

SURFACE-TUNNELING MICRO ELECTRON SOURCE AND ARRAY AND REALIZATION METHOD THEREOF

CROSS-REFERENCE TO RELATED APPLICATIONS

The present application is the national phase application of International Patent Application No. PCT/CN2017/094029 filed on Jul. 24, 2017, which claims priority to Chinese Patent Application No. 201610757325.3, titled "RESISTIVE SWITCHING MATERIAL-BASED MICRO ELECTRON SOURCE AND ARRAY THEREOF AND IMPLEMENTATION METHOD", filed on Aug. 29, 2016 and Chinese Patent Application No. 201710390423.2, titled "SURFACE TUNNELING MICRO ELECTRON SOURCE AND ARRAY THEREOF AND IMPLEMENTATION METHOD", filed on May 27, 2017 with the Chinese Patent Office, all of which are incorporated herein by reference in their entireties.

FIELD

The present disclosure relates to the field of electronic science and technology, and in particular to a surface tunneling micro electron source, an array of surface tunneling micro electron sources, and methods for making the same.

BACKGROUND

The electron source plays a core role in a vacuum electronic device (such as an X-ray tube, a high-power microwave tube, a cathode ray tube), which provides free electron beams indispensable to the operation of the vacuum electronic device, so that the electron source is an essential element for any vacuum electronic device. Currently, thermionic emission electron sources are used in almost all practical vacuum electronic devices. The working principle is that an electron emitter of the thermionic emission electron source is heated to a high temperature (which is generally greater than 1000K) so that electrons inside the emitter are emitted into vacuum after obtaining sufficient kinetic energy, which results in the problems of a high operating temperature, a high power consumption, a pre-heating delay, a short life, a wide electron energy distribution, a large size and difficulties in integration, greatly limiting the performance and development of the vacuum electronic devices. Therefore, it is desired to develop a new electron source that can avoid the above problems of the thermionic emission electron source. A tunneling electron source is an option.

Figure 1:
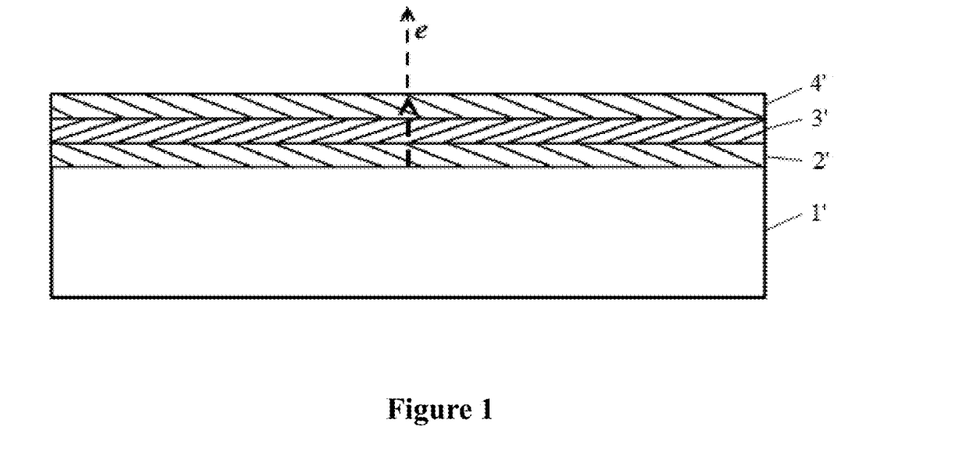
FIG. 1 is a schematic structural view of a tunneling electron source having a conventional vertical multi-layer structure, where a reference numeral 1' indicates a substrate, a reference numeral 2' indicates a first conductive layer, a reference numeral 3' indicates an insulating layer, and a reference numeral 4' indicates a second conductive layer.

The tunneling electron source, which is also referred to as an internal field emission electron source, is an electron source based on an internal quantum tunneling effect and having a structure of three layers including a metal (M) or semiconductor (S) layer, an insulator (I) layer, and another metal (M) or semiconductor (S) layer. Compared with a conventional thermionic emission electron source, the tunneling electron source has advantages of a low operating temperature, low power consumption, and having no pre-heating delay. The term "tunneling" is a concept in the field of quantum mechanics, which refers to the case that an electron may have a certain probability to pass over a barrier larger than kinetic energy of the electron. The tunneling electron source was first proposed by C. A. Mead in 1960. An initial structure of the tunneling electron source is an MIM structure in which a first metal layer (M), an insulating layer (I) and a second metal layer (M) are sequentially stacked on a substrate surface (see U.S. Pat. No. 3,056,073; Journal of Applied Physics, 1961, 32, 646). The operation principle is that a positive bias is applied on the second metal layer with respect to the first metal layer, with a value of the bias being greater than a value of the surface barrier of the second metal layer (in unit of electron volt). Since the insulating layer is very thin, electrons in the first metal layer can pass through the insulating layer and enter into the second metal layer due to the quantum tunneling effect, and the energy of the electrons is increased to be larger than the vacuum energy level of the second metal layer in the process of tunneling through the insulating layer. Since the second metal layer is very thin (similar to the electron mean free path), a part of the electrons tunneling through the insulating layer may further pass through the second metal layer without being scattered, and are emitted into vacuum from the surface of the second metal layer (see FIG. 1). In the tunneling electron source having the MIM structure, the electrons are subjected to strong electron-electron scattering when passing through the second metal layer, and therefore only a small proportion of the electrons can pass through the second metal layer and be emitted into the vacuum, which results in low (which is typically less than 1%) emission efficiency (the ratio of emission current to tunneling current). In order to improve the emission efficiency of the MIM tunneling electron source, an improved MIM tunneling electron source is developed by B. V. Dore et al. in 1961. In the improved MIM tunneling electron source, a layer of semiconductor material (e.g., alkali metal or alkaline earth metal oxide) having a low work function is applied to the second metal layer, to reduce the surface barrier to be overcome during the electron emission (see U.S. Pat. No. 3,184,636). A tunneling electron source having an SIS structure is developed by L. R. Apker in 1963, in which the first metal layer is replaced with a N-type silicon layer and the second metal layer is replaced with a semiconductor layer having a low electron affinity (see U.S. Pat. No. 3,214,629). In order to further improve the emission efficiency of the tunneling electron source, various optimizations have been made in the terms of material, thickness and structure of the insulating layer and the metal or semiconductor layer (see U.S. Pat. No. 3,706,920; Chinese Patent No. 981224733; IEEE Transactions on Electron Devices, 2000, 47, 1667; and IEEE Transactions on Electron Devices, 2002, 49, 1059), but the emission efficiency (the highest emission efficiency only reaches to 11%) of the tunneling electron source still cannot meet the requirements of practical applications (see IEEE Transactions on Electron Devices, 2012, 59, 2256).

At present, all tunneling electron sources are in vertically-stacked multi-layer structures of MIM, MIS or SIS. In this case, after tunneling through the insulating layer, the electron has to pass through the second metal or semiconductor layer to be emitted into the vacuum (see FIG. 1). The low emission efficiency of the tunneling electron source is mainly cause by the scattering that happens when passing through the second metal or semiconductor layer, which decreases the energy of the electrons. Further, it requires a complicated process to form the discrete vertically-stacked multi-layer structures and corresponding electrodes on a same substrate surface by the micro-fabrication technology, so that it is difficult to integrate the tunneling electron sources having the vertical multi-layer structures in a large-scale array (see IEEE Transactions on Electron Devices, 2002, 49, 1005).

SUMMARY

In view of this, an object of the present disclosure is to provide a new tunneling electron source, to solve technical problems existing in the conventional tunneling electron source of low emission efficiency and being difficult to achieve large-scale array integration.

The tunneling electron source provided in the present disclosure is a surface tunneling micro electron source having a planar multi-region structure. The tunneling electron source includes an insulating substrate. Two conductive regions and one insulating region are provided on a surface of the insulating substrate. The insulating region is arranged between the two conductive regions and abuts on the two conductive regions. Minimum spacing between the two conductive regions (that is, a minimum width of the insulating region) is less than 100 nm.

Preferably, the micro electron source further includes a pair of electrodes electrically connected to the two conductive regions respectively. The pair of electrodes is used to apply a voltage on the micro electron source such that electrons from the conductive region having a low electric potential tunnel through the insulating region and enter into the conductive region having a high electric potential, and then are emitted into vacuum near the boundary between the conductive region having a high electric potential and the insulating region (a thickness of the conductive region at the boundary is preferably less than twice an electron mean free path).

The minimum spacing between the two conductive regions (or the minimum width of the insulating region) is generally less than 100 nm, but the minimum spacing or the minimum width should be designed to ensure that the insulating region is not broken down by the voltage when significant electron tunneling and electron emission occur.

Preferably, in the surface tunneling micro electron source, a thickness of at least one of the conductive regions near the minimum spacing is less than twice the electron mean free path, usually similar to the electron mean free path (i.e., an average of distances traveled by an electron between two successive scattering processes).

In the surface tunneling micro electron source, the substrate may be a silicon substrate, a quartz substrate, an alumina substrate, a silicon carbide substrate or a glass substrate.

The pair of electrodes may be made of one or more of: metal, graphene, and carbon nanotube. The metal may be, for example, palladium or titanium. The graphene may be a single-layered graphene or multi-layered graphene. The carbon nanotube may be a single-walled carbon nanotube or a multi-walled carbon nanotube, and may be a single carbon nanotube or a carbon nanotube film.

Preferably, each of the conductive regions of the surface tunneling micro electron source is made of one or more metal materials and/or semiconductor materials, and at least one of the conductive regions is made of a material having a low work function. The conductive region made of the low work function material is the conductive region that has a high potential when a voltage is applied to the surface tunneling micro electron source. A lower work function of the material can lead to a better performance. The low work function material may be obtained by forming a thin layer of metal having a low work function, such as cesium, potassium or lithium, on a surface of a metal film such as gold or silver.

Preferably, the insulating region is made of one or more of: silicon oxide, tantalum oxide, hafnium oxide, zirconium oxide, aluminum oxide, yttrium oxide, scandium oxide, silicon nitride, diamond, and amorphous carbon.

Preferably, the two conductive regions and the insulating region of the surface tunneling micro electron source are formed in an activated resistive-switching material (when applied with a voltage, a conducting filament can be formed inside the material and can be ruptured or reconnected reversibly, so that the resistance can be greatly reversibly changed). A resistive-switching material unit including a conductive region, an insulating region and another conductive region that sequentially abut on each other is formed by providing a pair of electrodes respectively connecting to the two ends of a resistive-switching material and applying a voltage between the pair of electrodes to transform the resistive-switching material between the pair of electrodes from an insulating state to a low-resistance conducting state, and further from a low-resistance conducting state to a high-resistance conducting state. When the resistive-switching material is electrically transformed from the insulating state to the low-resistance conductive state, a conducting filament connecting the pair of electrodes is formed in the surface layer of the resistive-switching material. When the conducting filament is ruptured, the resistive-switching material is transformed from the low-resistance conductive state to the high-resistance conductive state.

The resistive-switching material may be one or more of: silicon oxide, tantalum oxide, hafnium oxide, tungsten oxide, zinc oxide, magnesium oxide, zirconium oxide, titanium oxide, aluminum oxide, nickel oxide, germanium oxide, silicon nitride and amorphous carbon.

Preferably, spacing between the pair of electrodes arranged at the two ends of the resistive-switching material is less than 10 micrometers, that is, the resistive-switching material unit including a conductive region, an insulating region and another conductive region that sequentially abut on each other and are formed between the pair of electrodes, has a length less than 10 micrometers in a direction of the spacing.

Another object of the present disclosure is to provide an array of surface tunneling micro electron sources including a number of the above surface tunneling micro electron sources arranged on a same substrate surface.

The principle of the surface tunneling micro electron source provided in the present disclosure is described in detail below.

Figure 2:
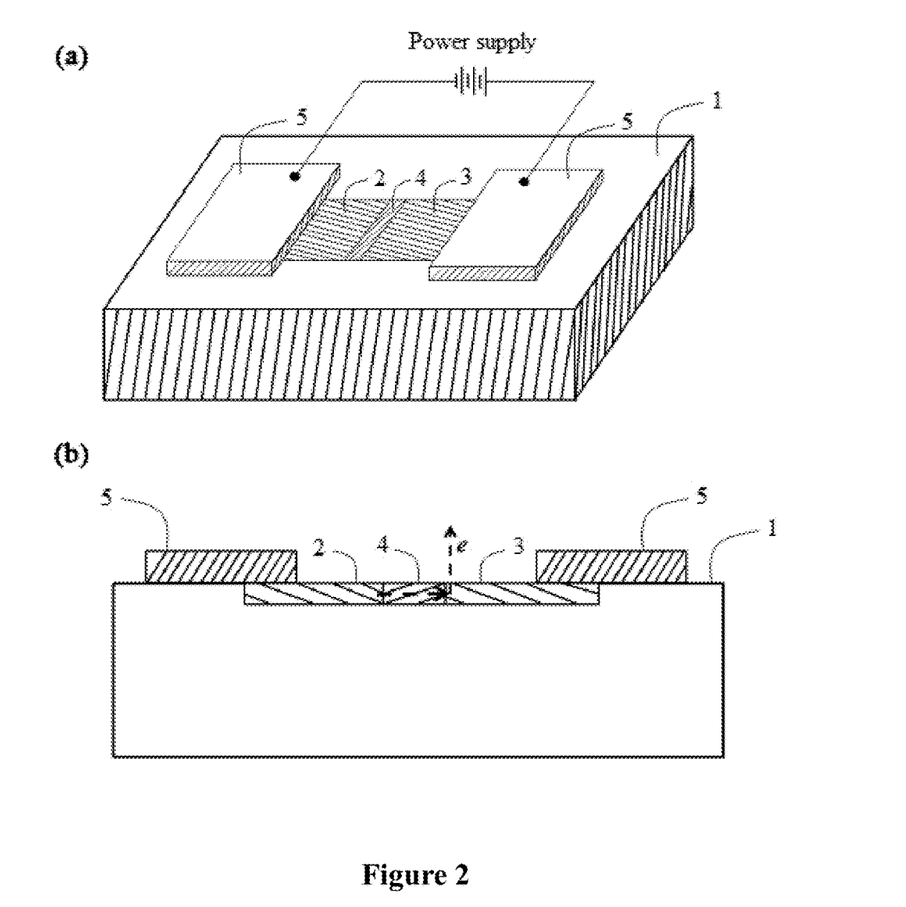
FIG. 2 is a schematic structural view of a surface tunneling micro electron source according to a first embodiment of the present disclosure, where
Figure 3:
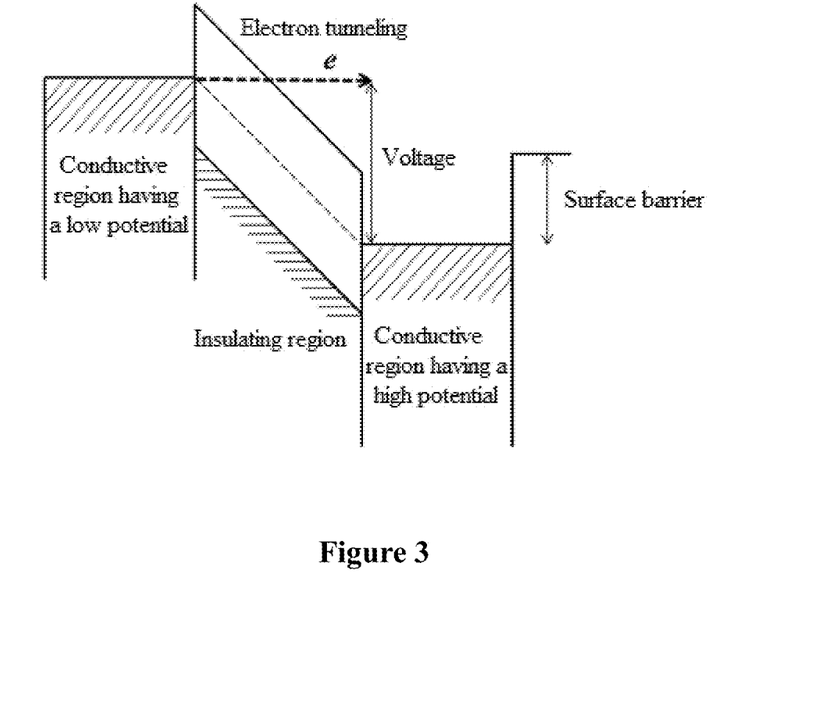
FIG. 3 is a schematic energy band diagram of a surface tunneling micro electron source according to the present disclosure.

The micro electron source provided in the present disclosure operates based on the quantum tunneling effect. As shown in FIG. 2, when a voltage is applied on two conductive regions 2 and 3 located in a surface layer of an insulating substrate 1 by a pair of electrodes 5, since the two conductive regions are separated by an insulating region 4 and the minimum spacing therebetween is small, an electron tunnels through the insulating region 4 from the conductive region 2 having a low potential at the minimum spacing and enters the conductive region 3 having a high potential. It can be seen from an energy band diagram in FIG. 3 that, in a case that the applied voltage is greater than the surface barrier of the conductive region having a high potential (in unit of electron volt), the energy of the electron is increased to a value larger than a vacuum energy level of the conductive region having a high potential after the electron tunnels through the insulating region. The electron is elastically scattered by lattices or defects after entering the conductive region having a high potential, such that the travel direction of the electron is changed without losing energy. The thickness of the conductive region having a high potential near the minimum spacing is similar to an electron mean free path. In this case, if the scattered electron travels towards the surface of the substrate and the kinetic energy of the electron in a direction perpendicular to the surface is greater than the surface barrier of the conductive region, the electron travels over the surface barrier, and is emitted into vacuum from the surface of the substrate.

It can be seen from the above principle that the minimum spacing between the two conductive regions should be appropriate to ensure that significant electron tunneling and electron emission can occur while the insulating region is not broken down by voltage after a voltage greater than the surface barrier (in unit of electron volt) of the conductive region is applied. Therefore, the minimum spacing is generally less than 100 nm. The conductive region having a high potential is preferably made of a material having a low work function, to reduce the surface barrier to be overcome during the electron emission. The thickness of the conductive region having a high potential near the minimum spacing should be similar to the electron mean free path to avoid electron scattering which reduces the energy of electron and thus suppresses the electron emission.

It can also be seen from the above principle that, different from the conventional tunneling electron source having a vertical multi-layer structure including a conductive layer (made of metal or semiconductor), an insulating layer, and another conductive layer (made of metal or semiconductor) (see FIG. 1), the surface tunneling electron source has a horizontal multi-region structure including a conductive region, an insulating region, and another conductive region. The electron is only required to pass through a part of the thickness of the conductive region having a high potential, instead of passing through multiple material layers, so that the surface tunneling electron source has higher emission efficiency than the conventional tunneling electron source having the vertical multi-layer structure. It is found that the emission efficiency of the surface tunneling electron source can be more than 50%. In addition, with the technology of micro/nano-fabrication and the like, the sizes of the conductive region, the insulating region and the electrodes can be in nanometer scale. Therefore, the surface tunneling electron source further has advantages of a simple structure in a direction vertical to the surface and a small size in a direction parallel to the surface, which facilitates large-scale array integration.

Two methods for making the surface tunneling micro electron source or an array thereof are further provided in the present disclosure.

A first making method includes:

(1) forming a pair of electrodes or an array thereof on a surface of an insulating substrate made of a resistive-switching material or a surface of an insulating substrate covered with a resistive-switching material film;

(2) applying a voltage between the pair of electrodes to transform the substrate made of the resistive-switching material or the resistive-switching material film between the pair of electrodes from an insulating state to a low-resistance conductive state, that is, a conducting filament is formed in the surface layer of the substrate made of the resistive-switching material or in the surface layer of the resistive-switching material film (the conducting filament extends through the substrate made of the resistive-switching material or the resistive-switching material film between the pair of electrodes, and is connected to the electrodes to form a filament-shaped conductive region); and (3) applying a voltage between the pair of electrodes to transform the substrate made of the resistive-switching material or the resistive-switching material film between the pair of electrodes from the low-resistance conductive state to a high-resistance conductive state, that is, the conducting filament is ruptured.

After the conducting filament is ruptured, two segments of conducting filaments are formed. The two segments of conducting filaments and a non-conductive region therebetween form two conductive regions of the surface tunneling electron source and an insulating region between the two conductive regions, thereby making the resistive-switching material between the pair of electrodes activated and forming the surface tunneling electron source, which have the ability to emit electrons. In some special cases, the above steps (2) and (3) can be performed in a same voltage applying process.

Preferably, the resistive-switching material in steps (1) to (3) is one or more of: silicon oxide, tantalum oxide, hafnium oxide, tungsten oxide, zinc oxide, magnesium oxide, zirconium oxide, titanium oxide, aluminum oxide, nickel oxide, germanium oxide, silicon nitride, and amorphous carbon.

Preferably, the pair of electrodes in steps (1) to (3) is made of one or more of: metal, graphene and carbon nanotube, and the spacing between the pair of electrodes is generally less than 10 micrometers.

A second making method includes:

(1) forming a pair of conductive films or an array of pairs of conductive films on a surface of an insulating substrate;

(2) forming an insulating film between each pair of conductive films; and (3) forming, for each pair of conductive films, a pair of electrodes connected to the pair of conductive films.

Each pair of conductive films and the insulating film therebetween respectively form two conductive regions and an insulating region of the surface tunneling electron source, thereby forming the surface tunneling electron source.

Preferably, the conductive films in steps (1) to (3) are made of one or more of: metal, graphene and carbon nanotube.

Preferably, the insulating film in steps (1) to (3) is made of one or more of: silicon oxide, tantalum oxide, hafnium oxide, zirconium oxide, aluminum oxide, yttrium oxide, scandium oxide, silicon nitride, diamond, and amorphous carbon.

In summary, there are provided a surface tunneling micro electron source, an array of surface tunneling micro electron sources, and two methods for making the same in the present disclosure. Compared with the conventional tunneling electron source having a vertical multi-layer structure, the surface tunneling micro electron source and the array thereof have advantages of high electron emission efficiency, simple structure and good workability, and can be easily integrated in a large-scale array, which solves the technical problems existing in the conventional tunneling electron source of low electron emission efficiency and being difficult to achieve large-scale array integration, and thus can be widely applied to various electronic devices involving electron sources, such as X-ray tubes, microwave tubes, flat panel displays.

BRIEF DESCRIPTION OF THE DRAWINGS

FIG. 2(a) is a schematic perspective view of the surface tunneling micro electron source, and FIG. 2(b) is a schematic sectional view of the surface tunneling micro electron source.

FIG. 5(a) is a schematic perspective view of the surface tunneling micro electron source, and FIG. 5(b) is a schematic sectional view of the surface tunneling micro electron source.

FIG. 6(a) is a schematic perspective view of the surface tunneling micro electron source, and FIG. 6(b) is a schematic sectional view of the surface tunneling micro electron source.

Reference numerals in FIGS. 2 to 9:

| | |
|---|---|
| 1 substrate, | 2 first conductive region, |
| 3 second conductive region, | 4 insulating region, |
| 5 a pair of electrodes, | 6 resistive-switching material film, |
| 7 silicon oxide film, | 8 a pair of graphene electrodes, |
| 9 metal interdigitated electrode, | 10 graphene strip, |
| 11 resistive-switching material unit, | 12 a pair of titanium-palladium electrodes |
| 13 silicon substrate covered with a silicon oxide film, | |
| and a dashed arrow indicates an electron tunneling or emission path. | |

DETAILED DESCRIPTION OF EMBODIMENTS

The embodiments of the present disclosure are illustrated in detail with reference to the drawings, which however is in no way limitation to the scope of the present disclosure.

First Embodiment

In this embodiment, conductive regions and an insulating region are embedded in an insulating substrate, and an upper surface of the conductive regions and the insulating region is flush with a surface of the insulating substrate.

As shown in FIG. 2, a surface tunneling micro electron source according to this embodiment includes an insulating substrate 1, conductive regions 2 and 3, an insulating region 4, and a pair of electrodes 5 for driving electron emission.

When a voltage is applied between the pair of electrodes 5 and a right electrode in the pair of electrodes has a high potential, an electron tunnels through the insulating region 4 from the conductive region 2 and enters into the conductive region 3, and finally is emitted into vacuum from the conductive region 3 near the insulating region in a direction perpendicular to the surface of the substrate.

Figure 4:
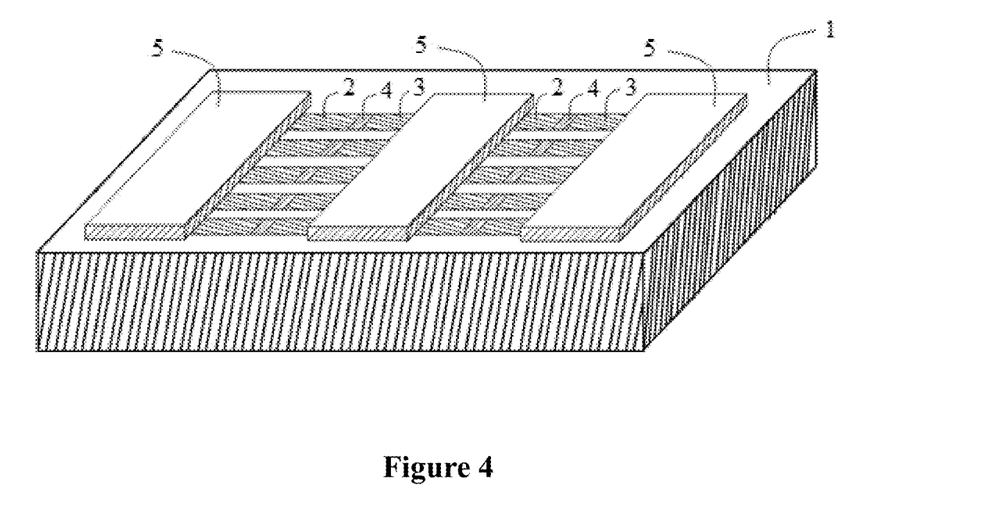
FIG. 4 is a schematic perspective view of an array of surface tunneling micro electron sources according to the first embodiment of the present disclosure.

As shown in FIG. 4, an array of surface tunneling micro electron sources according to this embodiment includes 2×5 surface tunneling micro electron sources as shown in FIG. 2, and all of the micro electron sources are arranged on a same substrate 1, and are connected in parallel with each other by pairs of electrodes 5.

Second Embodiment

In this embodiment, conductive regions and insulating region of the tunneling electron source are obtained in a resistive-switching material film by forming a conducting filament through an electrical forming process and then rupturing the conducting filament.

Figure 5:
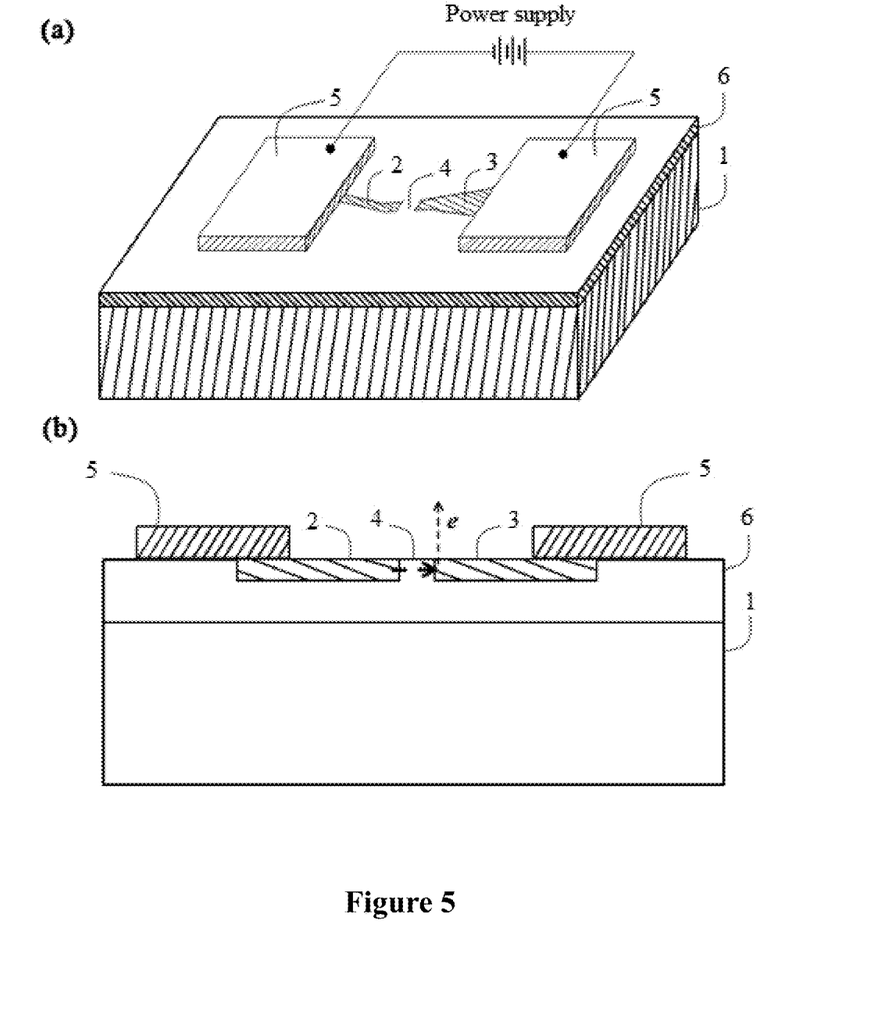
FIG. 5 is a schematic structural view of a surface tunneling micro electron source according to a second embodiment of the present disclosure, where

As shown in FIG. 5, the surface tunneling micro electron source according to this embodiment includes: a support substrate 1, a resistive-switching material film 6 covering a surface of the substrate, a pair of electrodes 5, and conductive regions 2 and 3 and an insulating region 4 formed by the rupture of the conducting filament.

When a voltage is applied between the pair of electrodes 5 and a right electrode of the pair of electrodes has a high potential, an electron tunnels through the insulating region 4 from the conductive region 2 and enters into the conductive region 3, and finally is emitted into vacuum from the conductive region 3 near the insulating region in a direction perpendicular to the surface of the substrate.

The surface tunneling micro electron source in this embodiment is made by the following steps:

(1) covering the surface of the substrate 1 with a resistive-switching material film 6, and forming the pair of electrodes 5 on the resistive-switching material film;

(2) applying a voltage between the pair of electrodes 5 to transform the resistive-switching material film between the pair of electrodes from an insulating state to a conductive state, where a conducting filament connecting the pair of electrodes is formed on the surface of the resistive-switching material film between the pair of electrodes; and (3) applying a voltage between the pair of electrodes 5 to transform the resistive-switching material film between the pair of electrodes to a high-resistance conductive state, where the conducting filament is ruptured, and two segments of conducting filaments formed after the rupture respectively form the conductive regions 2 and 3, and a non-conductive region between the two segments of conducting filaments forms the insulating region 4.

Third Embodiment

In this embodiment, conductive regions and an insulating region are located on a surface of an insulating substrate, and a lower surface of the conductive regions and the insulating region is flush with the surface of the insulating substrate.

Figure 6:
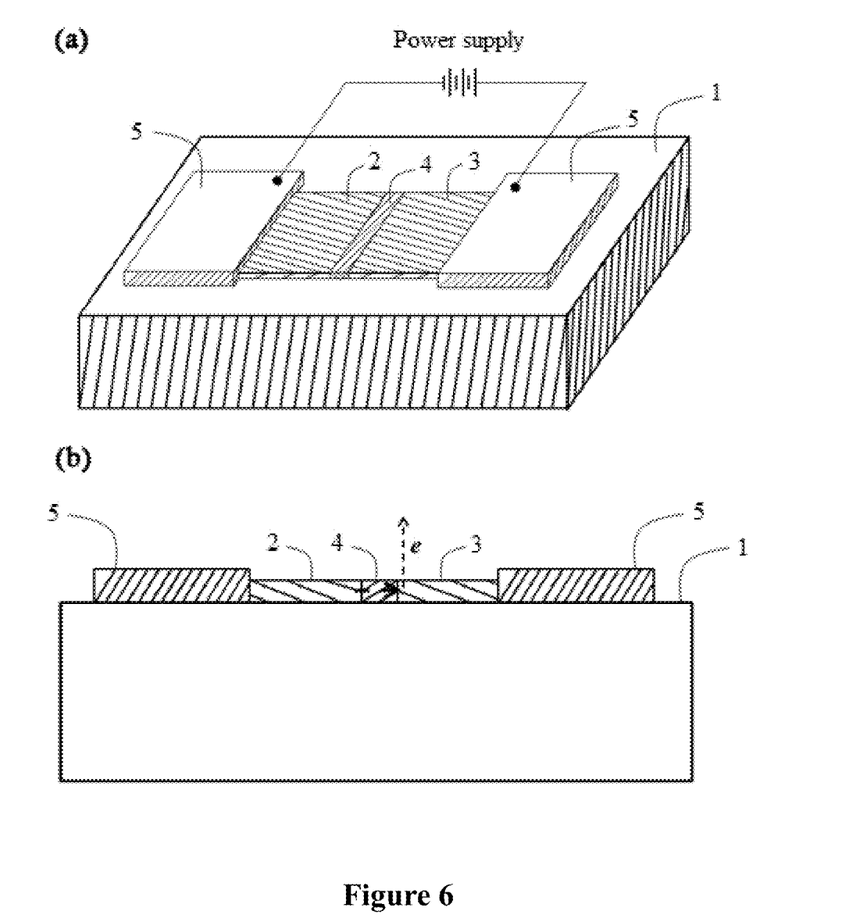
FIG. 6 is a schematic structural view of a surface tunneling micro electron source according to a third embodiment of the present disclosure, where

As shown in FIG. 6, a surface tunneling micro electron source according to this embodiment includes: an insulating substrate 1, conductive regions 2 and 3, an insulating region 4, and a pair of electrodes 5 for driving electron emission.

When a voltage is applied between the pair of electrodes 5 and a right electrode of the pair of electrodes has a high potential, an electron tunnels through the insulating region 4 from the conductive region 2 and enters into the conductive region 3, and finally is emitted into vacuum from the conductive region 3 near the insulating region in a direction perpendicular to the surface of the substrate.

The surface tunneling micro electron source in this embodiment is made by the following steps:

(1) forming two conductive films 2 and 3 on the surface of the insulating substrate 1;

(2) forming an insulating film 4 between the conductive films 2 and 3; and (3) forming a pair of electrodes 5 connected to the conductive films 2 and 3.

Fourth Embodiment

The surface tunneling micro electron source and the array thereof according to the second embodiment are made by a microfabrication method, using graphene as a material of a pair of electrodes, silicon oxide as a material of a resistive-switching material film, and a silicon wafer as a substrate as follows.

(1) The silicon wafer is placed in a reaction tube made of quartz glass, and the reaction tube is heated to 900° C. and is fed with oxygen gas, to form a silicon oxide film having a thickness of 300 nm by oxidizing a surface of the silicon wafer.

(2) A large-area graphene film obtained by a chemical vapor deposition method is transferred to the surface of the silicon wafer having the silicon oxide film 7, and is processed into parallel-arranged graphene strips 10 by spin coating an electron beam resist PMMA on the surface of the substrate, and performing an electron beam exposure process, a development and fixing process, a plasma etching process, a photoresist cleaning process and other processes. Then, metal interdigitated electrodes 9 perpendicularly connected to the parallel-arranged graphene strips are formed by spin coating the electron beam resist PMMA on the surface of the substrate and performing an electron beam exposure process, a development and fixing process, a metal film deposition process (70 nm Au/5 nm Ti), a lift-off process and other processes. The metal interdigitated electrodes 9 separate the graphene strips 10 to form an array of graphene units (each graphene unit having a size of about 2 µm×2 µm). A voltage is applied between the metal interdigitated electrodes 9 to rupture each graphene unit in the array into two segments, forming a slit having a width of approximately 100 nm between the two segments. In this case, each graphene unit is ruptured to form a pair of graphene electrodes 8, and an array of pairs of graphene electrodes connected in parallel by the metal interdigitated electrodes is formed on the surface of the substrate.

(3) A voltage is applied between the metal interdigitated electrodes 9, and the voltage value is gradually increased. Meanwhile, a current between the metal interdigitated electrodes 9 is monitored and a limiting current of 100 µA is set to prevent the silicon oxide film between the pair of graphene electrodes 8 from being broken down. When the current suddenly increases steeply, the voltage applying process is immediately stopped. At this point, the silicon oxide film between each pair of graphene electrodes 8 is transformed from an insulating state to a conductive state, and a conducting filament is formed between each pair of graphene electrodes 8.

(4) A voltage of about 20V is applied between the metal interdigitated electrodes 9 so that the silicon oxide film between each pair of graphene electrodes 8 is further transformed into a high-resistance conductive state, and the conducting filament is ruptured. In this way, each ruptured conducting filament forms a surface tunneling micro electron source including a conductive region, an insulating region, and another conductive region, and an array of surface tunneling micro electron sources connected in parallel by the metal interdigitated electrodes is formed in the surface layer of the substrate.

Figure 7:
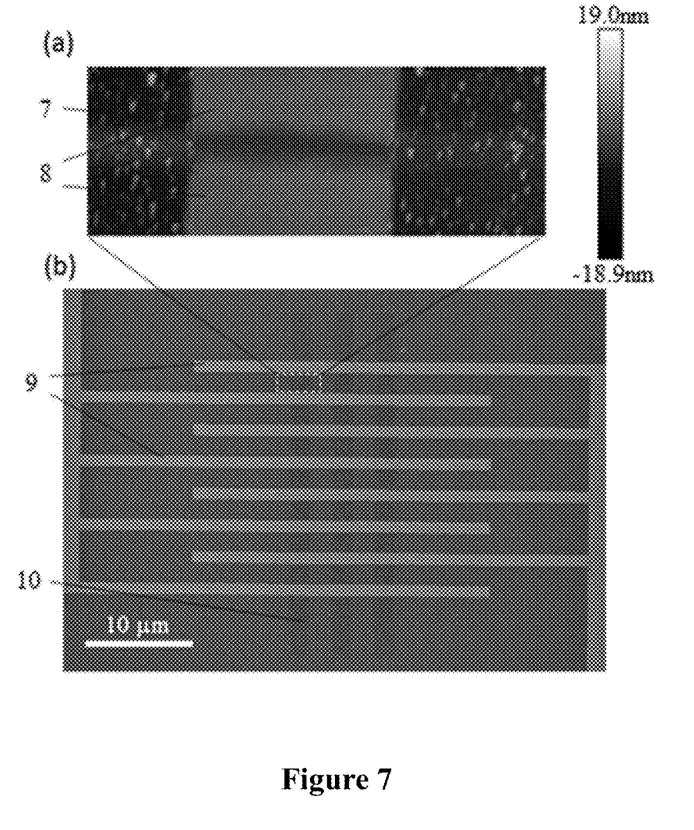
FIG. 7 shows an atomic force micrograph (a) of a single surface tunneling micro electron source and a scanning electron micrograph (b) of a 3×7 electron source array according to the second embodiment formed on a surface of a silicon substrate by microfabrication methods according to a fourth embodiment, using graphene as a material of a pair of electrodes and silicon oxide as a material of a resistive-switching material film, where the micrograph (a) is a partial enlarged photograph of a boxed region in the micrograph (b).

FIG. 7 shows an atomic force micrograph (a) of a single surface tunneling micro electron source formed by the above method and a scanning electron micrograph (b) of an electron source array. The electron source array includes 3×7 surface tunneling micro electron sources each including a pair of graphene electrodes 8, and two segments of conducting filaments formed between the pair of graphene electrodes through the resistive switching process on the silicon oxide film, and an insulating region between the two segments of conducting filaments (the conducting filaments are invisible in the atomic force micrograph).

Figure 8:
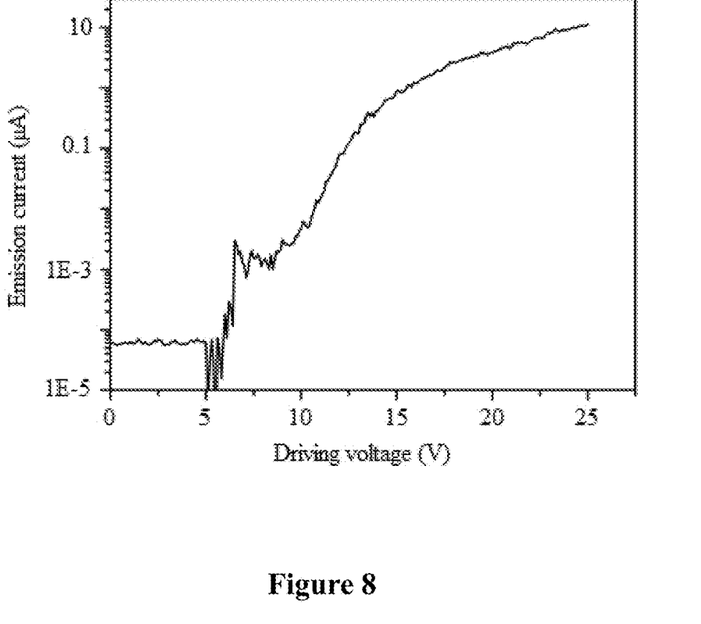
FIG. 8 is a graph showing a relationship between an emission current of the surface tunneling micro electron source shown in FIG. 7 and a voltage between interdigitated electrodes.

FIG. 8 is a graph showing a relationship between an emission current of the array of surface tunneling micro electron sources shown in FIG. 7 and a driving voltage between the interdigitated electrodes. It can be seen that when the driving voltage between the pair of electrodes is increased to about 6V, the electrons start to be emitted out, and the emission current increases as the driving voltage increases, and the emission current reaches 11.5 µA when the driving voltage is 25V.

Fifth Embodiment

The surface tunneling micro electron source according to the second embodiment is formed on the surface of the silicon substrate by a micromachining method, using palladium and titanium as a material of a pair of electrodes and silicon oxide as a material of the resistive-switching material film as follows.

(1) A silicon wafer is placed in a reaction tube made of quartz glass, and the reaction tube is heated to 900° C. and is fed with oxygen gas, to form a silicon oxide film having a thickness of 300 nm by oxidizing a surface of the silicon wafer.

(2) A pair of titanium-palladium metal (70 nm palladium/ 0.5 nm titanium) electrodes is formed on a surface of the silicon substrate covered with the silicon oxide film by spin coating an electron beam resist PMMA, and performing an electron beam exposure process, a development and fixing process, an electron beam evaporation metal deposition process, a lift-off process and others. The formed pair of titanium-palladium metal electrodes each has a width of 220 nm, and the spacing between the pair of electrodes is 50 nm.

(3) In the formed pair of titanium-palladium metal electrodes, one electrode is set to have a zero potential, and the other electrode is set to have a negative potential. The voltage applied between the pair of electrodes is gradually increased. Meanwhile, the current between the pair of electrodes is monitored and a limiting current of 10 µA is set to prevent the silicon oxide film between the pair of electrodes from being broken down. When the current suddenly increases steeply, the voltage increasing is stopped. At this point, the silicon oxide film between the pair of electrodes is transformed from an insulating state to a conductive state, and a conducting filament is formed between the pair of electrodes.

(4) A voltage of 15V is applied between the pair of titanium-palladium metal electrodes, so that the silicon oxide film between the pair of electrodes is further transformed into a high-resistance conductive state, and the conducting filament is ruptured. In this way, the ruptured conducting filament forms a surface tunneling micro electron source including a conductive region, an insulating region and another conductive region, in the surface layer of the substrate.

Figure 9:
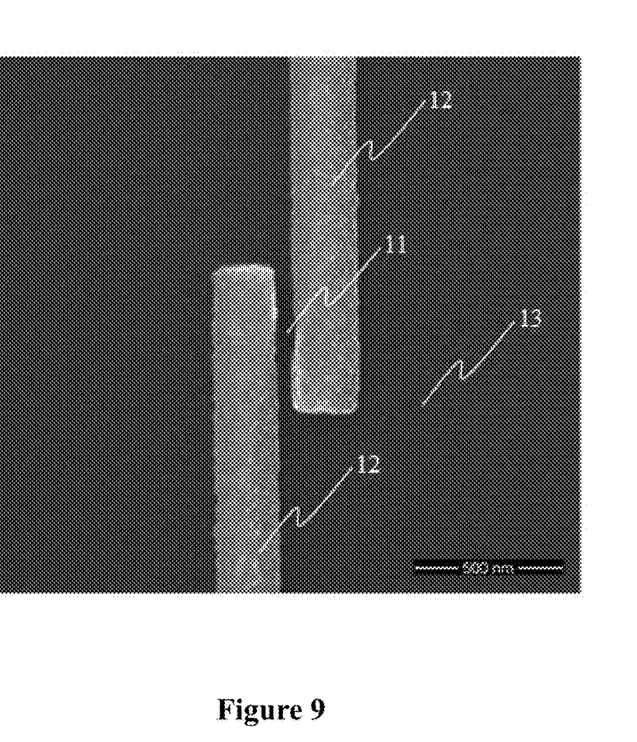
FIG. 9 is a scanning electron micrograph of a top view of a surface tunneling micro electron source formed on a surface of a silicon substrate by microfabrication methods according to a fifth embodiment, using palladium and titanium as a material of a pair of electrodes and silicon oxide as a material of a resistive-switching material film.

FIG. 9 is a photograph of a top view of the micro electron source made as above, obtained by scanning the micro electron source with an electron microscope. The micro electron source includes a silicon substrate 13 covered with a silicon oxide film, and a pair of titanium-palladium electrodes 12, and a resistive-switching material unit 11 including a conductive region, an insulating region and another conductive region formed in the silicon oxide film between the pair of palladium titanium electrodes 2.

Figure 10:
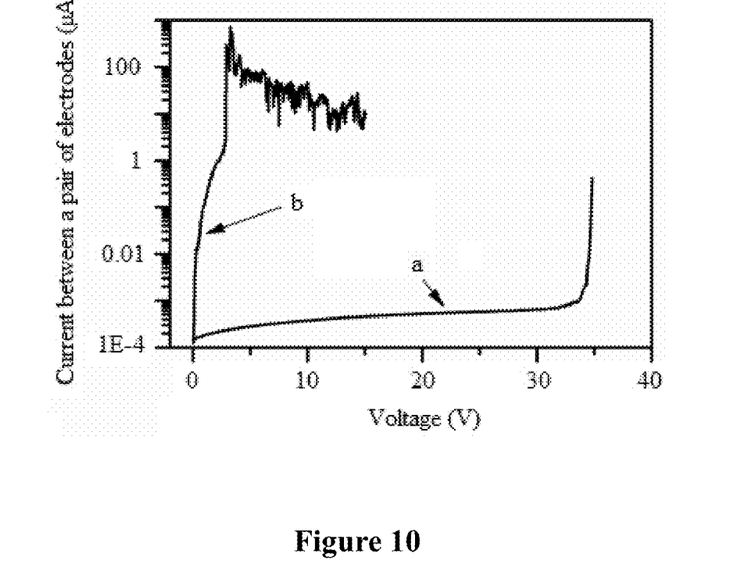
FIG. 10 is a graph showing a relationship between a current and a voltage between a pair of electrodes in (shown by curve a) and after (shown by curve b) the process that the silicon oxide film between the pair of electrodes is transformed from an insulating state to a conductive state in the method of forming the micro electron source shown in FIG. 9.

FIG. 10 is a graph showing a relationship between a current and a voltage between a pair of electrodes in and after the process of step (3) in the method of forming the surface tunneling micro electron source shown in FIG. 9. Curve a indicates a current-voltage curve of the pair of palladium titanium electrodes. It can be seen that when the voltage between the pair of electrodes is less than 34V, the current is extremely small and slowly increases with the voltage, presenting an insulating state. When the voltage increases to about 34V, the current suddenly increases steeply, which indicates that the silicon oxide film between the pair of electrodes changes from the insulating state to a conductive state. Curve b indicates a current-voltage curve after the silicon oxide film between the pair of the palladium titanium electrodes changes from the insulating state to the conductive state, presenting a good conductivity.

Figure 11:
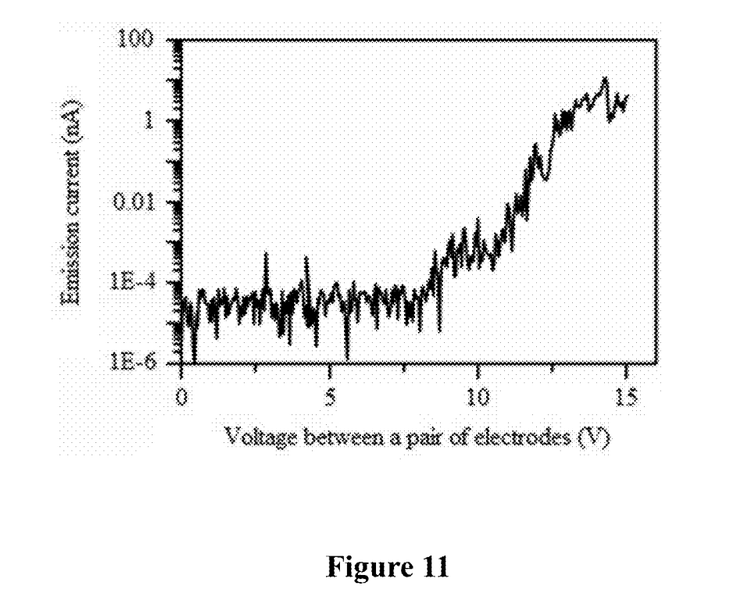
FIG. 11 is a graph showing a relationship between an emission current of the micro electron source shown in FIG. 9 and a voltage between a pair of electrodes.

FIG. 11 is a graph showing a relationship between an emission current of the micro electron source shown in FIG. 9 and a voltage between a pair of electrodes. It can be seen that when the driving voltage between the pair of electrodes increases to about 8V, the electrons start to be emitted out, and the emission current increases as the driving voltage increases, and the maximum measured emission current is about 10 nA.

The invention claimed is:

1. A tunneling electron source, wherein the tunneling electron source is a surface tunneling micro electron source having a planar multi-region structure, the tunneling electron source comprising:
an insulating substrate,
a pair of electrodes for driving electron emission, and
two conductive regions and one insulating region arranged on a surface or in a surface layer of the insulating substrate, wherein
the two conductive regions are arranged between the pair of electrodes, and are electrically connected to the pair of electrodes;
the insulating region is arranged between the two conductive regions and abuts on the two conductive regions, and
minimum spacing between the two conductive regions, which equals to a minimum width of the insulating region, is less than 100 nm.

2. The tunneling electron source according to claim 1, wherein at least one of the conductive regions has a thickness less than twice an electron mean free path at the minimum spacing.

3. The tunneling electron source according to claim 1, wherein
the substrate is a silicon substrate, a quartz substrate, an alumina substrate, a silicon carbide substrate or a glass substrate, and
the pair of electrodes is made of one or more of: metal, graphene, and carbon nanotube.

4. The tunneling electron source according to claim 1, wherein each of the conductive regions is made of one or more metal materials and/or semiconductor materials, and at least one of the conductive regions is made of a material having a low work function.

5. The tunneling electron source according to claim 1, wherein the insulating region is made of one or more of: silicon oxide, tantalum oxide, hafnium oxide, zirconium oxide, aluminum oxide, yttrium oxide, scandium oxide, silicon nitride, diamond, and amorphous carbon.

6. The tunneling electron source according to claim 1, wherein the two conductive regions and the one insulating region are formed in an activated resistive-switching material by:
forming a resistive-switching material unit comprising a conductive region, an insulating region and another conductive region that sequentially abut on each other, by providing a pair of electrodes respectively connecting to the two ends of a resistive-switching material and applying a voltage between the pair of electrodes to transform the resistive-switching material between the pair of electrodes from an insulating state to a low-resistance conductive state and further from the low-resistance conductive state to a high-resistance conductive state.

7. The tunneling electron source according to claim 6, wherein
the resistive-switching material is one or more of: silicon oxide, tantalum oxide, hafnium oxide, tungsten oxide, zinc oxide, magnesium oxide, zirconium oxide, titanium oxide, aluminum oxide, nickel oxide, germanium oxide, silicon nitride and amorphous carbon, and
spacing between the pair of electrodes respectively connecting to the two ends of the resistive-switching material is less than 10 micrometers.

8. A tunneling electron source array, wherein the tunneling electron source array is an array of surface tunneling micro electron sources, the tunneling electron source array comprising:
a number of tunneling electron sources according to claim 1, wherein the surface tunneling micro electron sources are arranged on a same substrate surface.

9. A method for making the tunneling electron source according to claim 6 or an array thereof, comprising:
1) forming a pair of electrodes or an electrode array thereof on a surface of an insulating substrate made of a resistive-switching material or a surface of an insulating substrate covered with a resistive-switching material film;

2) applying a voltage between the pair of electrodes to transform the substrate made of the resistive-switching material or the resistive-switching material film between the pair of electrodes from an insulating state to a low-resistance conductive state, to form a conducting filament in the surface layer of the substrate made of the resistive-switching material or in the surface layer of the resistive-switching material film; and 3) applying a voltage between the pair of electrodes to transform the substrate made of the resistive-switching material or the resistive-switching material film between the pair of electrodes from the low-resistance conductive state to a high-resistance conductive state, to rupture the conducting filament.

10. The method according to claim 9, wherein
the resistive-switching material is one or more of: silicon oxide, tantalum oxide, hafnium oxide, tungsten oxide, zinc oxide, magnesium oxide, zirconium oxide, titanium oxide, aluminum oxide, nickel oxide, germanium oxide, silicon nitride, and amorphous carbon;
the pair of electrodes is made of one or more of: metal, graphene and carbon nanotube; and
spacing between the pair of electrodes is less than 10 micrometers.

11. The method according to claim 9, wherein the steps 2) and 3) are performed in a same voltage applying process.

12. A method for making the tunneling electron source according to claim 1, comprising:
1) forming a pair of conductive films or an array of pairs of conductive films on a surface or in a surface layer of an insulating substrate;
2) forming an insulating film between each pair of conductive films; and
3) forming, for each pair of conductive films, a pair of electrodes connected to the pair of conductive films.

13. The method according to claim 12, wherein
the conductive films are made of one or more of: metal, graphene and carbon nanotube; and
the insulating film is made of one or more of: silicon oxide, tantalum oxide, hafnium oxide, zirconium oxide, aluminum oxide, yttrium oxide, scandium oxide, silicon nitride, diamond, and amorphous carbon.

14. A tunneling electron source, wherein the tunneling electron source is a surface tunneling micro electron source having a planar multi-region structure, the tunneling electron source comprising:
an insulating substrate, and
two conductive regions and one insulating region arranged on a surface or in a surface layer of the insulating substrate, wherein
the two conductive regions and the one insulating region are made from a resistive-switching material;
the insulating region is arranged between the two conductive regions and abuts on the two conductive regions, and
minimum spacing between the two conductive regions, which equals to a minimum width of the insulating region, is less than 100 nm.

15. The tunneling electron source according to claim 14, further comprising a pair of electrodes electrically connected to the two conductive regions respectively.

16. The tunneling electron source according to claim 14, wherein the two conductive regions and the one insulating region are made from the resistive-switching material by:
forming a resistive-switching material unit comprising a conductive region, an insulating region and another conductive region that sequentially abut on each other, by providing the pair of electrodes respectively connecting to the two ends of a resistive-switching material and applying a voltage between the pair of electrodes to transform the resistive-switching material between the pair of electrodes from an insulating state to a low-resistance conductive state and further from the low-resistance conductive state to a high-resistance conductive state.

17. The tunneling electron source according to claim 14, wherein the resistive-switching material is one or more of: silicon oxide, tantalum oxide, hafnium oxide, tungsten oxide, zinc oxide, magnesium oxide, zirconium oxide, titanium oxide, aluminum oxide, nickel oxide, germanium oxide, silicon nitride and amorphous carbon.

18. A tunneling electron source array, wherein the tunneling electron source array is an array of surface tunneling micro electron sources, the tunneling electron source array comprising:
a number of tunneling electron sources according to claim 14, wherein the surface tunneling micro electron sources are arranged on a same substrate surface.

* * * * *